(12) United States Patent
Schumacher

(10) Patent No.: US 6,566,973 B2
(45) Date of Patent: May 20, 2003

(54) EMI ENCLOSURE HAVING A WAVEGUIDE FOR CABLES

(75) Inventor: Richard A. Schumacher, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/944,826

(22) Filed: Aug. 31, 2001

(65) Prior Publication Data

US 2003/0042990 A1 Mar. 6, 2003

(51) Int. Cl.[7] .............................................. H01P 5/00
(52) U.S. Cl. ..................... 333/12; 333/248; 333/254; 333/211
(58) Field of Search ........................ 333/12, 211, 248, 333/254

(56) References Cited

U.S. PATENT DOCUMENTS

| | | | | |
|---|---|---|---|---|
| 4,728,910 A | * | 3/1988 | Owens | 219/693 |
| 5,028,891 A | * | 7/1991 | Lagerlof | 333/248 |
| 5,047,898 A | * | 9/1991 | Cooke et al. | 361/685 |
| 5,095,296 A | * | 3/1992 | Parker | 174/92 |
| 5,165,055 A | * | 11/1992 | Metsler | 333/12 |
| 5,262,737 A | * | 11/1993 | Siverling | 333/12 |
| 5,363,464 A | * | 11/1994 | Way et al. | 333/212 |
| 5,483,423 A | * | 1/1996 | Lewis et al. | 361/816 |
| 6,163,454 A | * | 12/2000 | Strickler | 361/695 |
| 6,365,828 B1 | * | 4/2002 | Kinoshita et al. | 174/35 R |
| 6,453,377 B1 | * | 9/2002 | Farnworth et al. | 710/300 |

* cited by examiner

*Primary Examiner*—Michael Tokar
*Assistant Examiner*—Khai M. Nguyen

(57) ABSTRACT

An electromagnetic enclosure is provided that this configured to enclose an electrical assembly. The enclosure includes a waveguide defining a channel that one or more cables from the electrical assembly pass through. The waveguide is dimensioned to attenuate radiation having a selected frequency range. With the present invention, shielding emitted or transmitted radiation around an opening in an enclosure and around cables can be easily done.

17 Claims, 1 Drawing Sheet

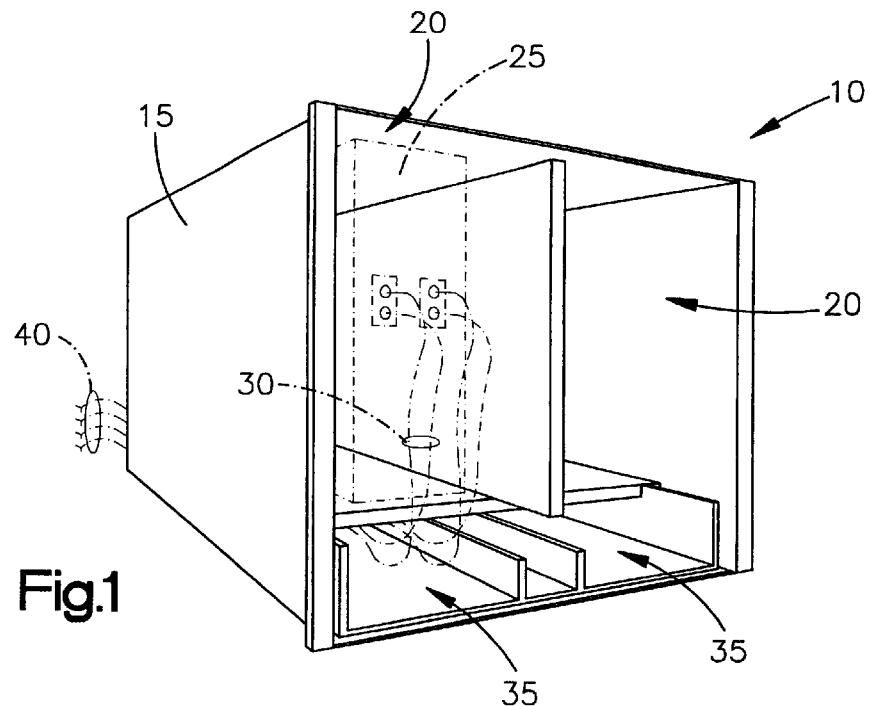
Fig.1
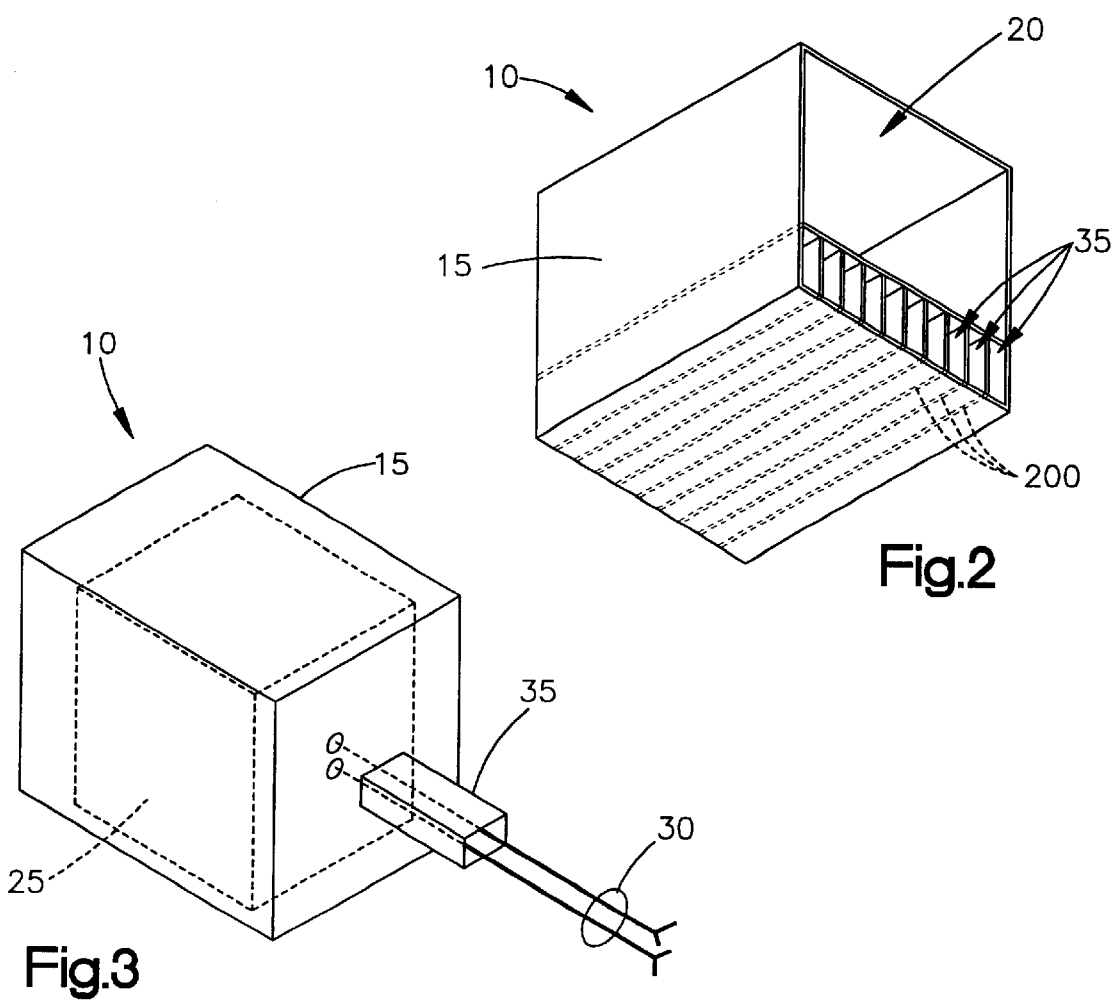
Fig.2
Fig.3

EMI ENCLOSURE HAVING A WAVEGUIDE FOR CABLES

FIELD OF THE INVENTION

The invention relates to the electromagnetic interference (EMI) shielding arts. It finds particular application to an enclosure for an electronic assembly where the enclosure includes a waveguide for cables. It will be appreciated that the present invention will find application in any electronic system where shielding of EMI is desired including mainframe computers, network servers and the like.

BACKGROUND OF THE INVENTION

Electromagnetic interference (EMI) is a common problem faced during the operation of electronic equipment. EMI is unwanted electromagnetic energy entering or emitting from a specific piece of electronic equipment, thereby causing interference. EMI can cause that piece of electronic equipment or electronic equipment nearby to function improperly or to not function at all.

Typically, electronic equipment is housed within a metallic enclosure to help reduce EMI problems. Metallic materials are electrically conductive which serve to block EMI. However, joints or other openings in the enclosure tend to provide a source of radiation leakage and thus cause a reduction in shielding effectiveness. Conventionally, this reduction has been ameliorated by the use of electrically conductive compliant gasket material trapped between the lid or panel and the rest of the enclosure. When the enclosure had cables passing though an opening, a cable shield termination device was required to secure the cable shield to and create an electrically conductive path with the enclosure. In other systems, cables had to pass through a clamp arrangement or other termination device. These types of shield termination devices do not provide much flexibility for configuring and installing EMI enclosures.

Furthermore, when shielding a pre-existing electronic assembly having attached cables, prior art enclosures were difficult to configure to properly shield the electronic device. They often required extensive time and labor for the cables to be disconnected and reconnected to accommodate the enclosure. Further time and labor may be required to modify existing cables to accept devices for terminating the cable shield to the enclosure. If the pre-existing electronic assembly or cables could not be modified, enclosing the assembly required a costly custom made enclosure, if even enclosing the assembly was possible.

The present invention provides a new and useful enclosure that cures the above problems and others.

SUMMARY OF THE INVENTION

According to the present invention, an enclosure is provided that includes a housing that reduces electromagnetic interference. A chamber is defined within the housing that receives an electronic assembly having one or more cables connected thereto. A waveguide is formed as a channel within the housing and has two opened ends allowing the one or more cables to extend through. The waveguide has electrically conductive sides and the channel is dimensioned to attenuate radiation having a selected frequency range.

One advantage of the present invention is that shielding an electrical assembly with cables is easily performed.

Still further advantages of the present invention will become apparent to those of ordinary skill in the art upon reading and understanding the following detailed description of the preferred embodiments.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

FIG. 1 is an exemplary perspective view of an enclosure having a cable waveguide extending along a bottom wall in accordance with the present invention;

FIG. 2 is another embodiment of the enclosure having a plurality of waveguides separated by partition walls in accordance with the present invention; and FIG. 3 is another embodiment of the enclosure having a waveguide projecting out therefrom.

DETAILED DESCRIPTION OF ILLUSTRATED EMBODIMENT

The following includes definitions of exemplary terms used throughout the disclosure. Both singular and plural forms of all terms fall within each meaning:

"Electromagnetic interference" also referred to as "EMI", as used in this disclosure, is understood to refer to electromagnetic emission and radiation that includes both electromagnetic interference (EMI) and radio-frequency interference (RFI). It also refers to other types of radiation that can interfere with the operation of nearby electrical equipment as known to those skilled in the art.

"Channel", as used in this disclosure, is understood to refer to a hollow passage through which something may pass. The channel includes any desired cross-sectional shape or configuration such as round, elliptical, flat, square, rectangular, triangular, other shapes or combinations of shapes at different points along the channel, and includes linear and non-linear channels.

Illustrated in FIG. 1 is an exemplary enclosure 10 in accordance with the present invention. The enclosure 10 is configured to enclose a pre-existing electrical assembly to reduce electromagnetic interference (EMI) to and/or from the electrical assembly. For example, the electrical assembly may include a computer, a network server, a PCI chassis (Peripheral Component Interface), or other electronic system that emits or may be affected by electromagnetic interference. In FIG. 1, the enclosure 10 is shown with a front wall removed to better illustrate the interior of the enclosure. In this embodiment, the front wall is an access door that is hinged or otherwise attached to the enclosure allowing the enclosure 10 to be easily opened and closed. It is of course necessary that such an access door or panel be adequately sealed against EMI when closed, for example by means of mechanically compliant electrically conductive gaskets etc.

The enclosure 10 includes a housing 15 formed of one or more walls made of an electrically conductive material, for example, sheet metal. Within the housing 15, one or more chambers 20 are defined that are sufficiently sized to receive a desired electrical assembly 25. Once an electrical assembly is received or otherwise installed within a chamber 20, transmission of electromagnetic interference to and from the enclosed assembly is reduced. Since openings may allow EMI to leak through, the enclosure 10 is constructed to minimize the number of openings and providing seals to make the access door EMI tight.

A typical electrical assembly 25 includes one or more cables 30 connected to it in order to transmit and receive signals from other electronic devices. Cables may also emit or be affected by electromagnetic radiation even when they are individually shielded as is known in the art. To provide additional shielding and to attenuate radiation out of or into the assembly 25, a waveguide 35 is formed as part of the enclosure 10 through which the cables 30 pass. The waveguide 35 is a channel formed with electrically conductive sides, including top and bottom, and is opened at both ends. One end of the waveguide is in direct communication with the chamber 20 so that the cables 30 enter the waveguide 35 from the assembly 25 without having to penetrate any walls. The openings allow passage of the cables and may additionally allow airflow to the assembly 25. In this embodiment, waveguide 35 is one channel that extends under both of the chambers 20. Of course multiple waveguides can be formed.

In this embodiment, the waveguide 35 is positioned adjacent the chamber 20 and along a wall of the enclosure but can be positioned in other locations in the enclosure according to a desired application. The waveguide 35 is dimensioned to attenuate radiation having a selected frequency range. By having appropriate dimensions as described below, the waveguide 35 can substantially attenuate selected radiation frequencies without requiring a lossy material and allows easy installation of the assembly 25.

The cross-sectional dimensions of the waveguide 35 (i.e. height and width) determine an approximate "cut-off" frequency which is the highest frequency of radiation that will be substantially attenuated by the waveguide. Conversely defined, the "cut-off" frequency is the lowest frequency of radiation which can propagate through the waveguide 35 with negligible attenuation, meaning, frequencies at the cut-off value and higher are negligibly shielded. Furthermore, the smaller the waveguide cross-sectional dimensions, the greater the "cut-off" frequency which results in a greater attenuated frequency range. Thus, to attenuate high frequency radiation, the waveguide 35 needs a smaller cross-section dimension. When dealing with lower frequency radiation, the cross-section dimensions can be increased (thus providing more space for cables) and still provide adequate radiation attenuation. Additionally, increasing the length of the waveguide 35 serves to provide additional attenuation capabilities for those frequencies below the "cutoff" frequency. The waveguide dimensioning is explained in more detail as follows.

Electromagnetic ("EM") waves can propagate both in transverse magnetic ("TM") and transverse electric ("TE") modes through a waveguide, which, as described above, is a hollow structure with electrically conductive inner walls. The lowest frequency that can propagate with negligible attenuation through a rectangular non-lossy waveguide 35 with cross-section dimensions a and b is called the "cut-off" frequency Fc. For example, this is given by Equation (1) as:

$$Fc = Vp/2a \quad (1)$$

where a is the larger dimension of the cross-section of the waveguide, and Vp is the phase velocity (e.g., the velocity of propagation for electromagnetic waves. For waveguides filled with air, Vp=c, the speed of light). The larger dimension controls the cut-off frequency.

Frequencies higher than the cut-off frequency pass through such a waveguide with negligible attenuation. A lower frequency f is attenuated by factor alpha as it passes through the waveguide as follows (with units of Nepers/meter):

$$\text{alpha} = (2*pi*f*(((Fc/f)^2)-1)^{0.5})/c \quad (2)$$

A hollow cable duct constructed of sheet metal constitutes such a waveguide. As an example, a duct in air with rectangular cross-section dimensions a=0.40 m, b=7 cm, and length=0.60 m, has a cutoff frequency Fc of 375 MHz found by:

$$Fc = (3*10^8)/2/0.4 = 375 \text{ MHz} \quad (3)$$

Frequencies greater than 375 MHz will propagate through this waveguide with negligible attenuation. Lower frequencies will be significantly attenuated. For example, electric and magnetic fields emitted by a 250 MHz source at one end of the waveguide will be attenuated at the other end by a factor of 0.03 calculated from Equation (4) as:

$$e^{-0.6*alpha}$$

where $$\text{alpha} = (2*pi*250*10^6)*((375/250)^2-1)^{0.5}/3\times10^8) \quad (4)$$

The power available for radiation from the far end of the waveguide at this frequency is attenuated by:

$$-20*log(0.03) = 30 \text{ dB} \quad (5)$$

The addition of cables into such a duct also establishes a multiple conductor transmission line system including the individual cables' shields and the walls of the duct, through which transverse electromagnetic mode ("TEM") waves may propagate without suffering the cutoff and attenuation effects described above. However, in most applications the geometry of these cables with respect to the duct and to surrounding grounded structures changes greatly as the cables enter and leave the duct. This change of geometry at a point in turn greatly changes the EM impedance of the transmission line structure, and this impedance change ("discontinuity") greatly hinders the propagation of TEM mode waves past that point. This effect will occur both where the cables enter the duct (that is, internal to the equipment being shielded) and external to the duct (external to the equipment), and additionally wherever the inner dimensions of the duct change significantly.

With further reference to FIG. 1, enclosing or installing the electronic assembly 25 into the EMI enclosure 10 is performed by the following exemplary steps. The access door (not shown) of the enclosure 10 is opened and the electronic assembly 25 is placed within a chamber 20. Unattached ends 40 of cables 30 are pushed through the waveguide 35 through one open end adjacent to the chamber 20 and exit out a far end of the waveguide 35. The access door is then closed enclosing the chamber 20, the waveguide 35, the assembly 25 and the cables 30. In another embodiment, to more easily install the assembly 25, the support surface in the enclosure 10 that the assembly 25 sits on is configured as a drawer that can be pulled and extended out from the enclosure. When extended, the assembly 25 is placed on the support surface without other walls of the enclosure interfering with installation. The support surface and the electrical assembly 25 are then pushed back into the enclosure.

Illustrated in FIG. 2 is another embodiment of the enclosure 10 in accordance with the present invention. The enclosure 10 includes a plurality of waveguides 35 each separated by a partition wall 200. The partition walls are made of electrically conductive material, such as sheet metal, and are solid. Alternately, a partition wall 200 can be hollow through its length or may be filled with an electromagnetic shielding material as known in the art. As shown in FIG. 2, the waveguides 35 have a smaller cross-sectional dimension than shown in FIG. 1 and, thus, have the capability to attenuate higher frequency radiation.

Illustrated in FIG. 3 is another embodiment of the enclosure 10 in accordance with the present invention. The waveguide 35 projects out from the enclosure 10 rather than extending along a wall of the enclosure. This configuration is suited for particular applications or installation environments that may require a projecting cable waveguide.

In another embodiment of the present invention, the waveguide 35 is coated or filled with a lossy material to increase attenuation of high frequency radiation. In certain situations, high frequency radiation is desired to be attenuated but the size and/or amount of cables present require the waveguide dimensions to be large. For example, due to its size, the dimensions provide attenuation up to a cutoff frequency that is below the high frequencies involved. In this case, the waveguide includes an electrically lossy dielectric material to absorb the higher frequency radiation.

The electrically lossy dielectric can be a flexible dielectric material (e.g. plastic, rubber, or foam) for good conformance to the conductive surfaces of the waveguide 35. The electrically lossy character of the dielectric can be achieved by colloidal resistive graphite particles dispersed throughout the dielectric. The dispersion can be uniform or nonuniform. In the latter case, the density of the graphite particles can vary transversely between the conductors or longitudinally along the conductors. In the latter case, the corresponding changes in impedance along the transmission path can result in multiple reflections, each of which results in additional dissipation of unwanted EMI. Such enhanced dissipation can also be achieved by varying the dielectric thickness or the dielectric constant longitudinally.

An exemplary lossy material is Eccosorb QR-12 made by Emerson & Cumming which has a colloidal graphite dispersed in a polymer matrix. This material has an electrical loss tangent of 0.4 at 100 MHz, and a relative dielectric constant of 5.4. The magnetic loss tangent for Eccosorb QR-12 is basically zero and in any event considerably less than its electrical loss tangent. Of course, one of ordinary skill in the art will appreciate that other lossy materials are known in the art and can be used with the present invention.

With the present invention, pre-existing electronic assemblies can be easily enclosed to shield electromagnetic radiation. Cables may pass freely through the waveguide without the need for arrangements for cables penetrating a wall of the EMI enclosure 10. This avoids the need to re-design the cables and avoids introducing additional connections or termination devices in the cable signal path. The enclosure 10 further allows existing assemblies, which are not permitted to be modified, to be re-used while improving its EMI or EMC (electro magnetic compatibility) performance. With the attenuation properties of the waveguide, it can be made as a non-lossy channel.

Furthermore, the present enclosure, in some cases can be applied as a retrofitted wrapper around "pre-installed" equipment which, in addition to not being modifiable, cannot be uninstalled or disconnected. This is distinct from configuring the enclosure to fit pre-existing equipment that cannot be modified but will be installed into a new housing which incorporates the present enclosure.

Additionally, the configuration of the enclosure and waveguide, for example in FIG. 1, allow multiple enclosures to be stacked on one another to more efficiently use space. This also allows cables to be easily connected between different electrical assemblies 25 in different enclosures if so desired.

Although FIG. 1 is illustrated with two chambers 20 and one waveguide 35, it will be appreciated that any number of chambers and waveguides can be formed in the enclosure 10 including one or more of each. It will also be appreciated that the enclosure 10, the chamber 20, and the waveguide 35 can be configured in other shapes and configurations than the ones shown.

While the present invention has been illustrated by the description of embodiments thereof, and while the embodiments have been described in considerable detail, it is not the intention of the applicants to restrict or in any way limit the scope of the appended claims to such detail. For example, the enclosure 10 may include a plurality of waveguides 35 that are differently positioned within the enclosure rather than being side-by-side. Also, a waveguide can have a different dimension than other waveguides within the enclosure. A waveguide can be defined in the enclosure at a position other than along a wall. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicant's general inventive concept.

I claim:

1. An enclosure comprising:

a housing that reduces electromagnetic interference;

a chamber defined within the housing for receiving an electronic assembly having one or more cables connected thereto;

a waveguide forming a channel within the housing, the channel having at least one first open distal end, at least one second open distal end and a continuous passageway between the first and second open distal ends for allowing the one or more cables to extend through, the waveguide having electrically conductive sides and the channel is dimensioned to attenuate radiation having a selected frequency range; and wherein the waveguide is formed with a rectangular cross-section; and wherein a lowest frequency which can propagate with negligible attenuation through the rectangular waveguide having cross-section dimensions a and b is a cut-off frequency Fc defined by Fc=Vp/2a where a is a larger dimension of the cross-section of the waveguide, and VP represents a velocity of propagation for electromagnetic waves.

2. The enclosure as set forth in claim 1 wherein the waveguide includes a lossy material.

3. The enclosure as set forth in claim 1 wherein the housing and the waveguide are configured to enclose a pre-existing electronic assembly having one or more cables where the waveguide surrounds the cables to reduce transmission of radiation without having to modify the pre-existing electronic assembly.

4. The enclosure as set forth in claim 1 wherein the waveguide is configured where decreasing the channel dimension expands the selected frequency range of the attenuated radiation.

5. The enclosure as set forth in claim 1 wherein the waveguide is formed along a wall of the housing.

6. The enclosure as set forth in claim 1 wherein the housing is formed of sheet metal.

7. The enclosure as set forth in claim 1 further including a plurality of waveguides.

8. The enclosure as set forth in claim 1 further including a plurality of chambers.

9. An enclosure comprising:
a housing that reduces electromagnetic interference;
a chamber defined within the housing for receiving an electronic assembly having one or more cables connected thereto;
a waveguide forming a channel within the housing, the channel having at least one first open distal end, at least one second open distal end and a continuous passageway between the first and second open distal ends for allowing the one or more cables to extend through, the waveguide having electrically conductive sides and the channel is dimensioned to attenuate radiation having a selected frequency range; and
wherein the waveguide is formed projecting out from the housing.

10. An enclosure for enclosing an electronic assembly having one or more cables, and shielding electromagnetic interference, the enclosure comprising:
a housing formed of an electrically conductive material;
at least one chamber formed within the housing and configured to receive an electronic assembly; and
a waveguide, formed with the housing, defining a channel having at least one first open distal end, at least one second open distal end and a continuous passageway between the first and second open distal ends for one or more cables to pass through, the waveguide having dimensions determined in accordance with a cut-off frequency, and substantially attenuating radiation frequencies that propagate through the waveguide being lower than the cut-off frequency; and
wherein the waveguide is an enclosed channel projecting out from the housing.

11. The enclosure as set forth in claim 10 wherein the chamber is configured to receive and enclose a pre-existing electrical assembly, having one or more cables connected thereto and passing through the waveguide, without having to modify the pre-existing electrical assembly.

12. The enclosure as set forth in claim 10 wherein the waveguide includes a lossy material attached along the electrically conductive walls which material attenuates transmission of radiation at frequencies above the cut-off frequency of the waveguide.

13. The enclosure as set forth in claim 10 including a plurality of waveguides formed with the housing.

14. An enclosure for enclosing an electronic assembly having one or more cables, and shielding electromagnetic interference, the enclosure comprising:
a housing formed of an electrically conductive material;
at least one chamber formed within the housing and configured to receive an electronic assembly; and
a waveguide, formed with the housing, defining a channel having at least one first open distal end, at least one second open distal end and a continuous passageway between the first and second open distal ends for one or more cables to pass through, the waveguide having dimensions determined in accordance with a cut-off frequency, and substantially attenuating radiation frequencies that propagate through the waveguide being lower than the cut-off frequency; and
wherein the waveguide includes at least two dimensions, one dimension being larger than the other, and where the cut-off frequency is controlled by the larger dimension.

15. The enclosure as set forth in claim 14 wherein the waveguide includes an open end in direct communication with the at least one chamber.

16. The enclosure as set forth in claim 14 wherein the waveguide is formed within the housing.

17. An enclosure for enclosing one or more electronic assemblies having one or more cables comprising:
a housing formed of an electrically conductive material, the housing having a housing cable entry;
at least one chamber formed within the housing and configured to receive an electronic assembly; and
a cable portion formed within the housing and having at least one first open distal end, at least one second open distal end and a continuous passageway between the first and second open distal ends;
the first open distal end configured to allow entry of one or more cables from the housing cable entry into the passageway and the second open distal end configured to allow exit of the one or more cables from the passageway into the at least one chamber for connection to the electronic assembly; and
the cable portion having dimensions determined in accordance with a cut-off frequency and substantially attenuating radiation frequencies that propagate through the passageway lower than the cut-off frequency.

* * * * *